United States Patent
Tsuno et al.

(10) Patent No.: US 6,441,378 B1
(45) Date of Patent: Aug. 27, 2002

(54) MAGNETIC ENERGY FILTER

(75) Inventors: Katsushige Tsuno, Tokyo (JP); Eric Munro, London; John Rouse, Surrey, both of (GB)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 09/585,852

(22) Filed: Jun. 1, 2000

(30) Foreign Application Priority Data

Jun. 1, 1999 (JP) .......................................... 11-153732

(51) Int. Cl.$^7$ .............................. G21K 1/08; H01J 3/14; H01J 3/26; H01J 9/42; H01J 40/00; H01J 47/00
(52) U.S. Cl. ........................... 250/396 ML; 250/396 R; 250/305
(58) Field of Search ........................ 250/281, 396 ML, 250/305, 396 R

(56) References Cited

U.S. PATENT DOCUMENTS

| | | | |
|---|---|---|---|
| 4,740,704 A | 4/1988 | Rose et al. | 250/396 |
| 4,760,261 A | 7/1988 | Rose et al. | 250/396 |
| 5,448,063 A | * 9/1995 | De Jong et al. | 250/305 |
| 6,150,657 A | * 11/2000 | Kimoto et al. | 250/305 |
| 6,307,205 B1 | * 10/2001 | Tsuno | 250/396 ML |

OTHER PUBLICATIONS

"High–Resolution imaging magnetic energy filters with simple structure", S. Lanio, *Optik 3,* No. 3 (1986), pp. 99–107.

"Performance of a new high–resolution electron energy–loss spectroscopy microscope", Masami Terauchi et al., *Microsc. Microanal. Microstruct.* 2 (1991), pp. 351–358.

* cited by examiner

*Primary Examiner*—John R. Lee
*Assistant Examiner*—David A. Vanore
(74) *Attorney, Agent, or Firm*—Webb Ziesenheim Logsdon Orkin & Hanson, P.C.

(57) ABSTRACT

A compact magnetic energy filter having at least four magnetic fields to deflect the trajectory of an electron beam from the entrance window to the exit slit. A rotational symmetry axis is located midway between the second and third magnetic fields. The magnetic fields on the opposite sides of the rotational symmetry axis are opposite in polarity.

7 Claims, 9 Drawing Sheets

DISPERSION (um/eV) = 5.146
DISPERSION

X GAMMA & X CHI

Y DELTA

MAGNETIC ENERGY FILTER

BACKGROUND OF THE INVENTION

1. Field of the Invention

The present invention relates to a magnetic energy filter having plural magnetic fields designed to deflect the trajectory of the electron beam from the entrance window to an exit slit.

2. Description of the Related Art

FIG. 4 shows an example of the structure of an electron microscope having electron optics incorporating an OMEGA energy filter. FIG. 5 illustrates the structure of the A-type OMEGA energy filter. FIG. 6 illustrates the structure of the B-type OMEGA energy filter. FIGS. 7(a) and 7(b) illustrate the fundamental trajectory in the A-type OMEGA energy filter. FIGS. 8(a) and 8(b) illustrate the fundamental trajectory in the B-type OMEGA energy filter.

In-column energy filters, such as OMEGA energy filters and Castain-Henry filters, are often used as energy filters connected with electron microscopes in use because the microscope column can be incorporated in the microscope while maintaining the column straight. In an electron microscope having electron optics incorporating the OMEGA energy filter, an electron gun 11 emits an electron beam that is directed to a specimen 14 through condenser lenses 12, as shown in FIG. 4. An observable image of the specimen is projected onto a fluorescent screen 20 via an objective lens 13, an intermediate lens 15, an entrance window 16, an OMEGA energy filter 17, an exit slit 18, and a projector lens 19. In this OMEGA-type energy filter, four magnetic fields $M_1$, $M_2$, $M_3$, and $M_4$, where the beam has radii of curvature $R_1$, $R_2$, $R_3$, and $R_4$, respectively, are arranged to form an Ω-shaped trajectory. The electron beam is passed through these magnets in turn such that the outgoing beam is aligned with the incident beam. FIGS. 5 and 6 show two examples of geometry of the magnetic polepieces and electron trajectory. A straight line on which the incident beam and the outgoing beam are aligned with each other or a straight line passing through both entrance window and exit slit is referred to as the "straight axis" herein. The center trajectory of the beam deflected by the magnetic fields of the filter, as shown in FIGS. 5 and 6, is referred to as the "optical axis indicating the center trajectory of the filter" herein.

In this way, an instrument having an OMEGA energy filter inserted in or behind the imaging lens system of a transmission electron microscope is used as an apparatus for electron spectroscopic imaging (ESI). In OMEGA energy filters, ALPHA energy filters, and so on, the optical axis of the incident beam is in line with the optical axis of the outgoing beam. Plural magnetic fields are developed. Therefore, such an OMEGA energy filter is inserted in the imaging lens system to deflect the trajectory of the electron beam from the entrance window to the exit slit, and this is called an in-column ESI instrument. On the other hand, a filter in which a single-sector magnet is combined with a multipolar corrector is also available. In this filter, the optical axis of the outgoing beam makes an angle of about 90° to the incident beam. Therefore, this filter is mounted behind the microscope column and known as a post-column filter.

An OMEGA energy filter is a typical in-column filter. The prototype of this filter was manufactured by combining a magnetic field prism, an electrostatic mirror, and another magnetic field prism to form an in-column filter (originally known as the Castain-Henry filter) and replacing the electrostatic mirror by a magnetic field prism so that all the deflecting elements were made of magnetic fields. This filter was developed in the 1970s in France and consists of three magnetic fields. Since then, aberration theories of filters have been investigated in Germany. It has been found that use of four magnets is more advantageous than use of three magnets. Subsequent researches have been conducted into systems using four magnets.

In a sector-shaped magnet having a uniform magnetic field, the beam is focused in a direction x parallel to the plane of the magnetic polepieces in which energy dispersion takes place. However, no focusing action occurs in the direction of the magnetic field y. Accordingly, in the case of an OMEGA energy filter, the end surfaces of the magnetic polepieces are tilted to produce a quadruple lens action which focuses the beam in the direction of the magnetic field. The two examples shown in FIGS. 5 and 6 are designed under different optical conditions. The geometry of FIG. 5 is called type A in which three focusing actions take place in the direction x parallel to the plane of the magnetic polepieces and also in the direction of magnetic field y. The geometry of FIG. 6 is called type B in which three focusing actions take place in the direction x parallel to the plane of the magnetic polepieces, and two focusing actions occur in the direction of the magnetic field y. Their differences in fundamental optics can be seen from the trajectory diagrams of the types A and B shown in FIGS. 7 and 8, respectively, where the optical axis indicating the center trajectory of the filter is drawn as a straight line.

In these trajectory diagrams, both trajectories $x_\alpha$ and $y_\beta$ are trajectories of an electron beam that will finally form a focused electron microscope image on the fluorescent screen. On the other hand, trajectories $x_\gamma$ and $y_\delta$ are trajectories of an electron beam focused onto the entrance window plane of the filter by the previous stage of lens. After passage through the filter, these trajectories $x_\gamma$ and $y_\delta$ are focused onto the exit slit plane. On reaching the exit slit plane, the electron beam is sufficiently dispersed according to its energy. The exit slit selects only a desired energy range of the beam. The image on the fluorescent screen is formed by an energy range of the beam passed through the exit slit. If the dispersion is left behind, a blurring will take place. Therefore, the dispersion must disappear on the image plane, which is called the achromatic condition. The OMEGA energy filter has a great feature in that the trajectory is made symmetrical with respect to the center plane, canceling out the aperture aberration on the image plane and distortions.

In the OMEGA energy filter, in order to make some second-order aberrations zero and to reduce the remaining aberrations, the plane between the second magnet $M_2$ and the third magnet $M_3$ is used as a plane of symmetry (center plane). Thus, the beam trajectories before and after the plane of symmetry are rendered symmetrical. In particular, let LL be the distance from the image plane (pupil plane) to the exit slit plane. The image plane (pupil plane) of the incident beam is adjusted to be at a distance of LL from the entrance window plane. Under these conditions, types A and B differ on the trajectory in the y-direction (in the direction of the magnetic field) as follows. With the type A, relations $y_\beta=0$ and $y_\delta'=0$ hold on the plane of symmetry as shown in FIGS. 7(a) and 7(b). With the type B, relations $y_\beta'=0$ and $y_\delta=0$ hold on the plane of symmetry as shown in FIGS. 8(a) and 8(b). Note that "'" indicates differentiation with respect to z, i.e., the gradient of the trajectory. In either type, the x trajectory gives $x_\alpha=0$ and $x_\gamma'=0$ on the plane of symmetry under the same conditions for both beams.

If the initial conditions are selected in this way for the type A, then trajectory $x_\gamma$ is focused three times and trajectory $y_\delta$ is also focused three times, as shown in FIGS. 7(a) and 7(b). The focused points are indicated by the arrows, respectively, in the figure. For type B, trajectory $x_\gamma$ is focused three times but trajectory $y_\delta$ is focused only twice, as shown in FIGS. 8(a) and 8(b). That is, the image is turned over. The presence of these two types of OMEGA energy filters has been known for many years.

In the case of an electron microscope, an energy filter is used: (1) as a monochrometer for limiting the energy from an electron source to create a highly monochromatic beam, (2) as an electron energy loss spectroscope (EELS) for measuring the energy loss created by a specimen, and (3) as an energy filtering transmission electron microscope (EFTEM) for creating an image from zero-loss electrons excluding energy-loss electrons or from only loss electrons. The characteristics that are currently sought in these applications are to have great dispersion.

The most known method for creating great dispersion is to provide retarding. Usually, an energy filter has a dispersion of about 1/1000 to 1/10000 of the energies of incident electrons. Therefore, if the energies of incident electrons are lowered, the resolution of the observable energy becomes higher. For this purpose, however, the energy filter must be placed in a field across which a high voltage is applied. Consequently, this complicates the instrumentation or makes it bulky.

SUMMARY OF THE INVENTION

The present invention is intended to solve the foregoing problems. It is an object of the present invention to provide a magnetic energy filter which has an elongated beam path, has an increased sum of the absolute values of beam deflection angles, and is compact.

This object is achieved in accordance with the teachings of the present invention by a magnetic energy filter having plural magnetic fields and designed to deflect the trajectory of an electron beam from an entrance window to an exit slit, the energy filter having the following features. The filter has at least four magnetic fields. A rotational symmetry axis is located midway between the second and third magnetic fields. The magnetic fields on the opposite sides of the boundary between the second and third magnetic fields are opposite in polarity. Deflecting magnetic fields are mounted on opposite sides of a straight axis. The sum of the absolute values of the beam deflection angles in the magnetic fields, respectively, is in excess of 540° or is about 720°.

Other objects and features of the invention will appear in the course of the description thereof, which follows.

DESCRIPTION OF THE PREFERRED EMBODIMENTS

Figure 1:
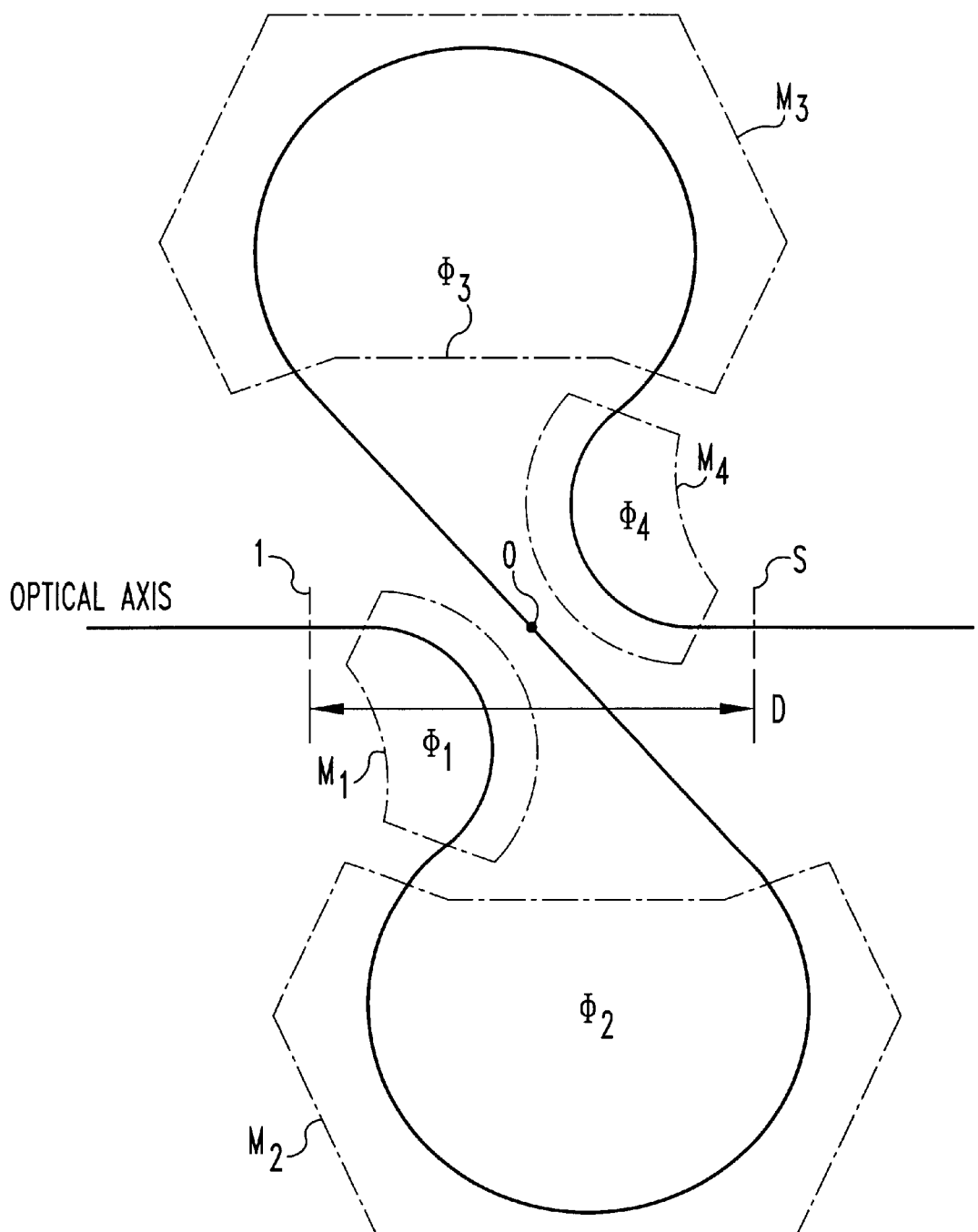
FIG. 1 is a diagram of a magnetic energy filter in accordance with the present invention.

The preferred embodiments of the present invention are hereinafter described with reference to the accompanying drawings. FIG. 1 shows the structure of a magnetic energy filter in accordance with the present invention. FIGS. 2(a) to 2(f) are diagrams illustrating fundamental trajectories based on the results of a simulation of the magnetic energy filter in accordance with the present invention.

Figure 2A:
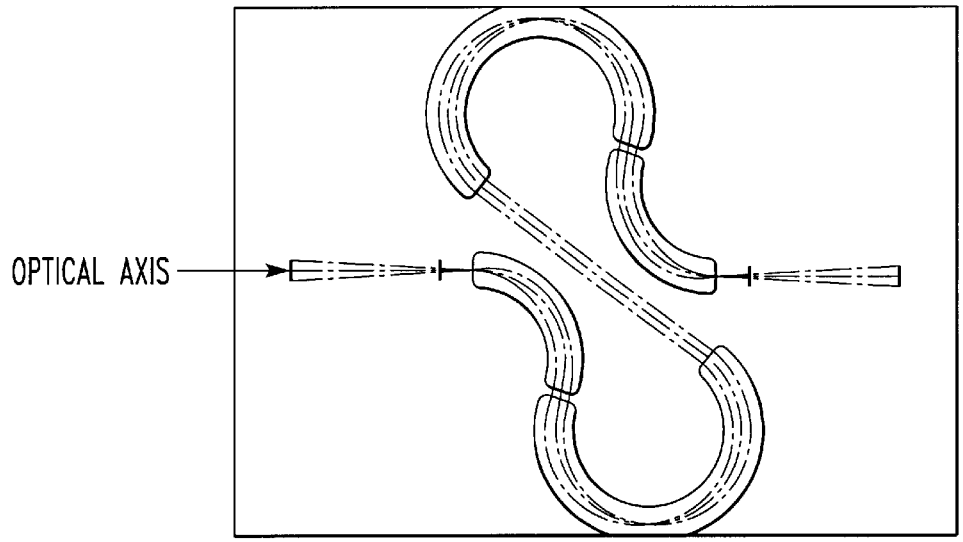
FIGS. 2(a)–2(f) are diagrams comparing fundamental trajectories based on the results of a simulation of the magnetic energy filter in accordance with the present invention.
Figure 2C:
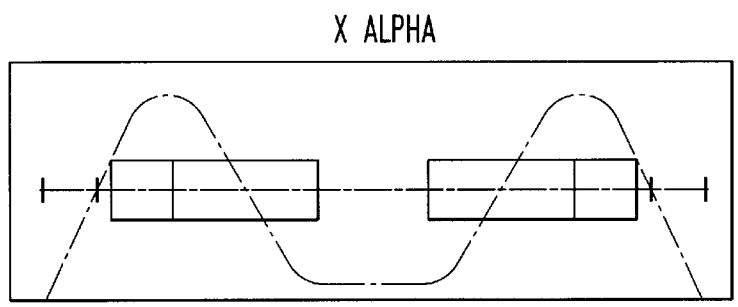
Figure 2D:
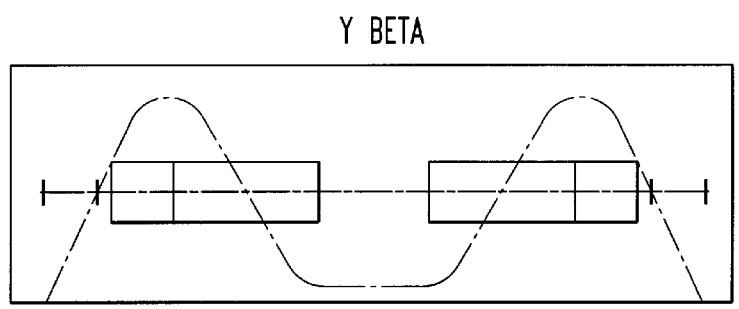
Figure 2B:
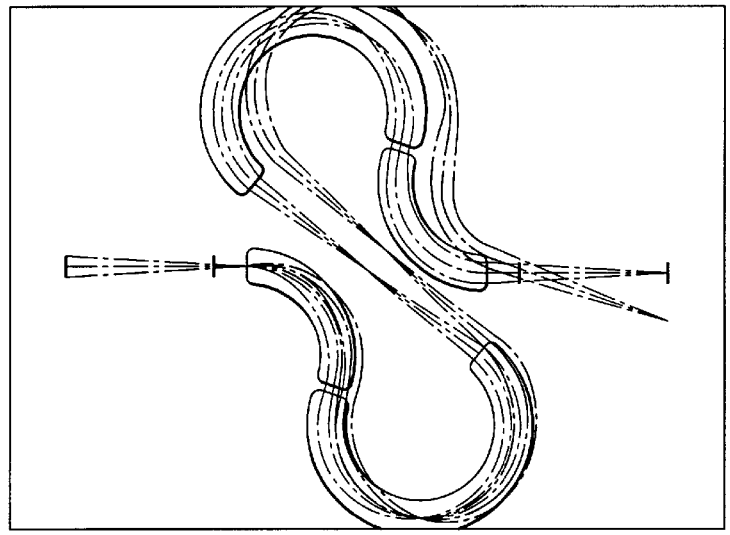
Figure 2E:
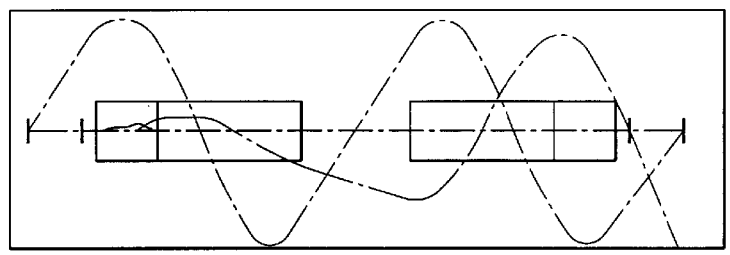
Figure 2F:
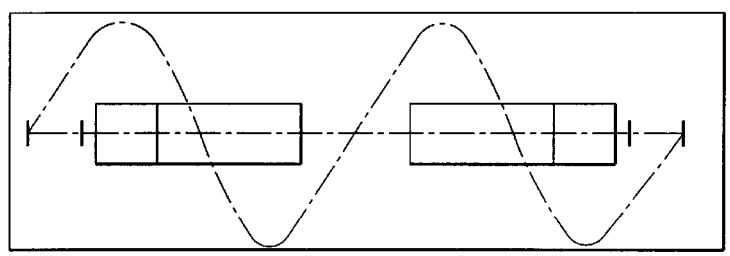

FIG. 2(a) illustrates the trajectory of an electron beam forming an electron microscope image projected onto an entrance window plane. The electron beam creating a focused electron microscope image on the entrance window plane forms four crossover points in total and then forms a focused electron microscope image on the exit split plane again. FIG. 2(b) illustrates the trajectory of the electron beam having certain (two) energies within electron beams passing through the entrance window. The electron beams passing through the entrance window are focused three times and undergo a fourth focusing action on the exit slit plane. If electron beams have different energies, they draw different trajectories and are focused at different locations on the exit slit plane. Therefore, only an electron beam having a desired energy can be selected with an exit slit. FIG. 2(c) illustrates the trajectory $x_\alpha$ (x alpha) of the electron beam forming a microscope image, the trajectory being parallel to the magnetic polepiece plane. FIG. 2(d) illustrates the trajectory $y_\beta$ (y beta) of the electron beam forming a microscope image, the trajectory being in the same direction as the direction of the magnetic field. FIG. 2(e) indicates the trajectory $x_\gamma$ (x gamma) of an electron beam with a desired energy parallel to the magnetic polepiece plane, as well as the magnitude of dispersion $x_\chi$ (x chi) along the optical axis. FIG. 2(f) indicates the trajectory $y_\delta$ (y delta) of an electron beam having a desired energy in the direction of the magnetic field.

Referring to FIG. 1, there are shown magnets $M_1$–$M_4$, an entrance window I, and an exit slit S. The trajectory of an electron beam in the geometry of FIG. 1 is described below. The electron beam impinges in the direction of the optical axis indicated by the arrow. The beam forms a crossover point (focused point) on the plane of the entrance window I and then hits a filter. The electron beam passed through the entrance window I enters the magnetic field of magnet $M_1$ having a deflection angle of $\phi_1$. The beam is deflected through $\phi_1$. In the figure, the beam is shown to be deflected in a clockwise direction. The beam then exits from the field and undergoes a first focusing action from the filter.

Then, the beam enters the magnet $M_2$ having a deflection angle of $\phi_2$ and is deflected through $\phi_2$ in the reverse direction. In the figure, the beam is shown to be deflected in a counterclockwise direction. The beam then leaves the magnet $M_2$ and passes across a point O at which a straight axis intersects the trajectory of the electron beam. The beam undergoes a second focusing action near this point O. After passing across the point O, the beam enters the magnet $M_3$ that is located on the opposite side of the straight axis and has a deflection angle of $\phi_3$. In this magnet, the beam is deflected through $\phi_3$ in a clockwise direction and exits from the magnet, where $\phi_3=-\phi_2$. Then, the beam undergoes a third focusing action.

The beam going out of the magnet $M_3$ passes into the magnet $M_4$ having a deflection angle of $\phi_4$, where $\phi_4=-\phi_1$ In this magnet, the beam is deflected through $\phi_4$ in a counterclockwise direction and exits from the magnet.

The electron beam leaving the magnet $M_4$ reaches the exit slit and undergoes a fourth focusing action on the exit slit plane. Under this condition, the electron beam is dispersed sufficiently because of variations in energy. Accordingly, the electron beam having only the desired energy passes through the exit slit and leaves the filter.

The point O located midway between the magnets $M_2$ and $M_3$ is referred to as the midpoint. An axis that passes through this point and is vertical to the plane of the paper gives a two-fold rotational symmetry axis or a two-fold rotation axis for the selected electron beam path through the filter. That is, the physical structure of the filter gives a two-fold rotational symmetry around the axis passing through the point O (with the exception of the polarities of the magnets explained hereafter).

In the magnetic energy filter in accordance with the present invention, magnets are located on opposite sides of the straight axis as described above. Furthermore, they are arranged with two-fold rotational symmetry. Compared with conventional filters, such as an OMEGA filter and an ALPHA filter where magnets are placed on only one side of a straight axis, the beam path can be elongated and the sum of the absolute values of the beam deflection angles can be increased without increasing the distance between the entrance and the exit of the filter, i.e., the distance D between the entrance window I and the exit slit S.

Therefore, the magnetic energy filter designed as described above in accordance with the present invention is more compact than the prior art OMEGA filter. In the geometry of FIG. 1, the beam deflection angles are assumed to be 110°, −250°, 250°, and −110° in this order from the entrance side. The sum of the absolute values of the deflection angles is 720°, which is twice that of the deflection angle of the ALPHA filter. In the case of the prior art OMEGA filter, the limit values of practical deflection angles of the four magnets are assumed to be 125°, −125°, −125°, and 125° in this order. The sum of the absolute values of the deflection angles is 500°, which is 1.4 times as large as the conventional value.

Where the energy filter proposed heretofore is made up of four magnetic fields $M_1$, $M_2$, $M_3$, and $M_4$, the magnetic fields $M_2$ and $M_3$ located on the opposite sides of the symmetry plane are identical in polarity. In a magnetic energy filter (hereinafter referred to as the S filter) in accordance with the present invention, the magnetic fields $M_2$ and $M_3$ located on the opposite sides of the rotational symmetry axis are opposite in polarity.

In the example of FIGS. 1 and 2, the sum of the absolute values of the deflection angles is 720°. In the S filter where the magnetic fields 1 and 2 are opposite in polarity, if the sum of the absolute values of the deflection angles is set greater than 540°, the beam path can be elongated and the sum of the absolute values of the beam deflection angles can be increased without increasing the distance between the entrance and exit of the filter, i.e., the distance D between the entrance window I and the exit slit S. Hence, the purpose of the present invention is achieved.

Figure 5:
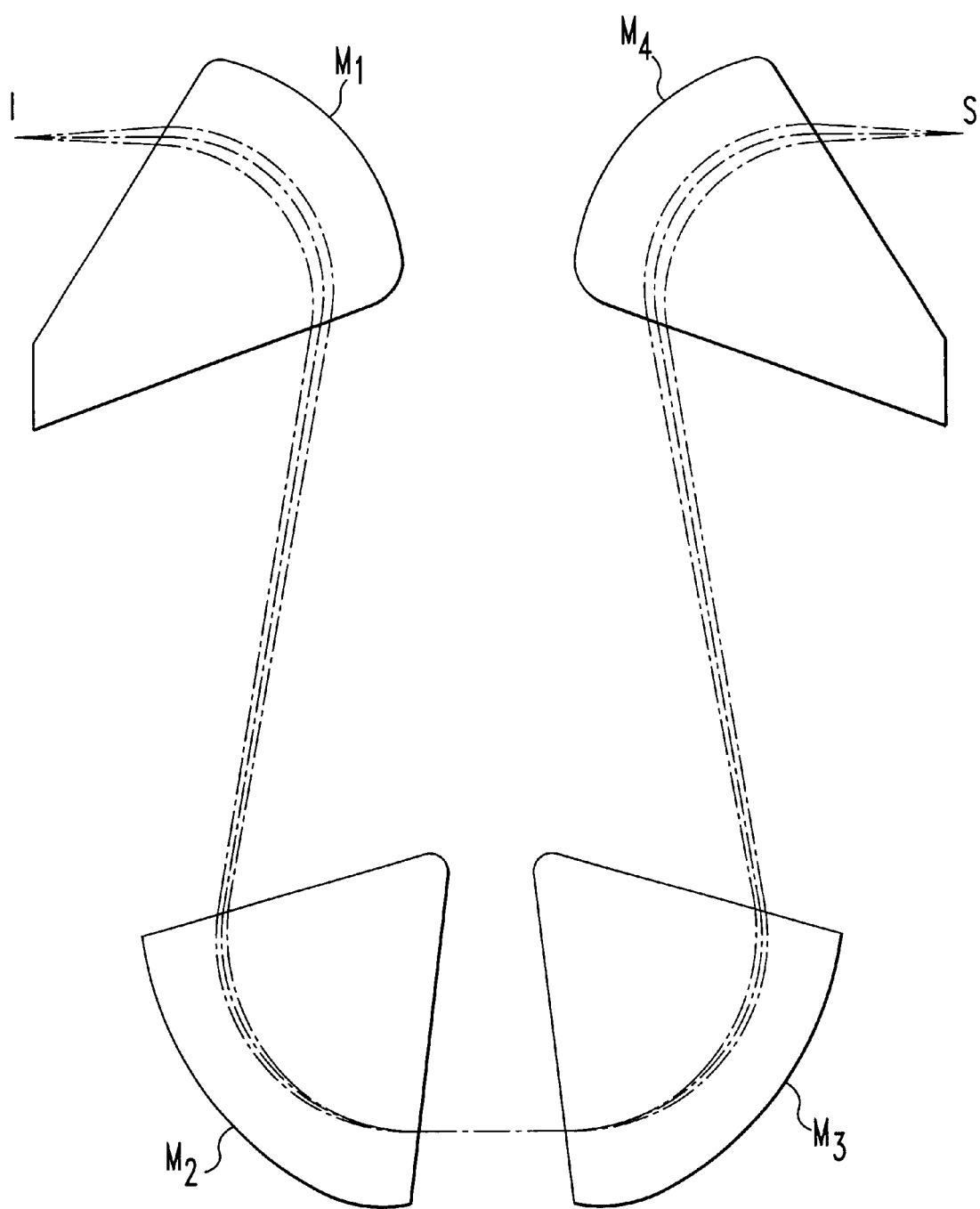
FIG. 5 is a diagram illustrating an A-type OMEGA energy filter.
Figure 6:
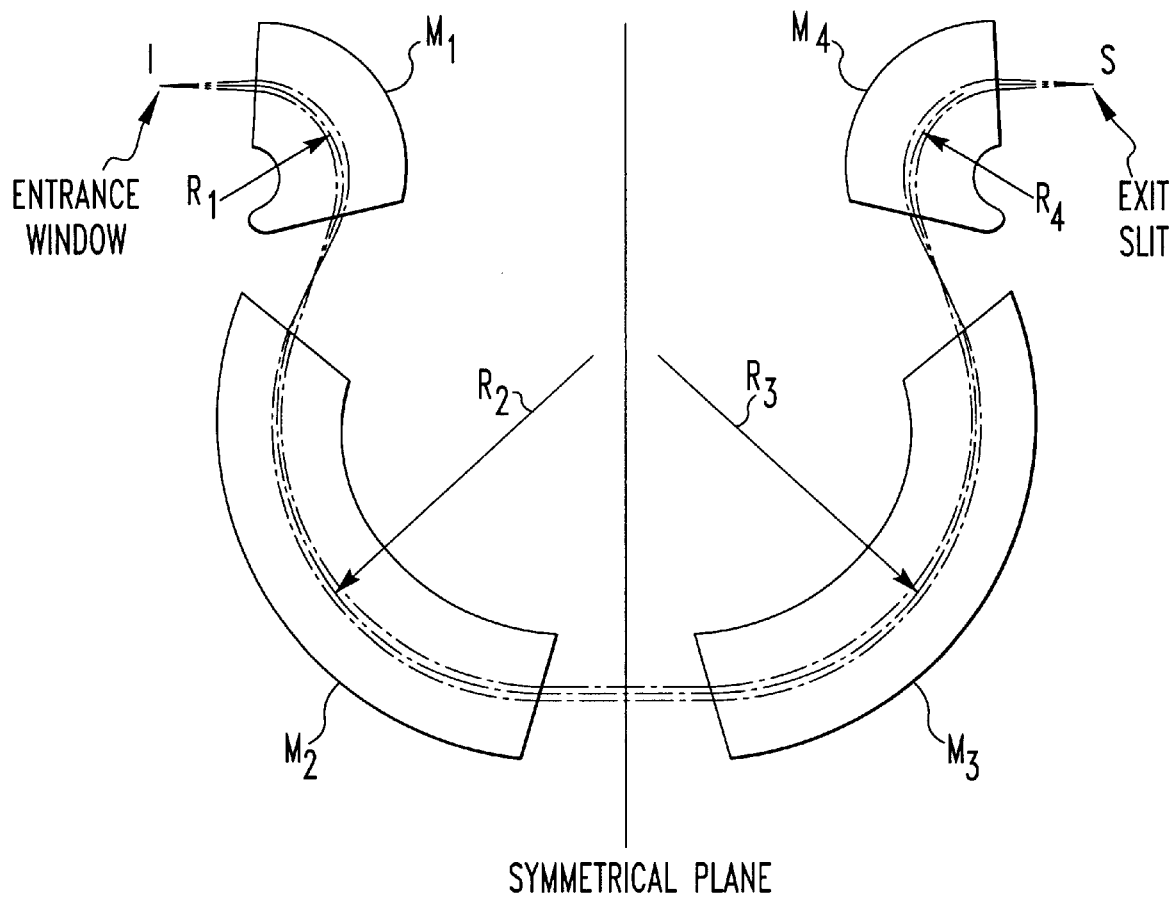
FIG. 6 is a diagram illustrating a B-type OMEGA energy filter.
Figure 7A:
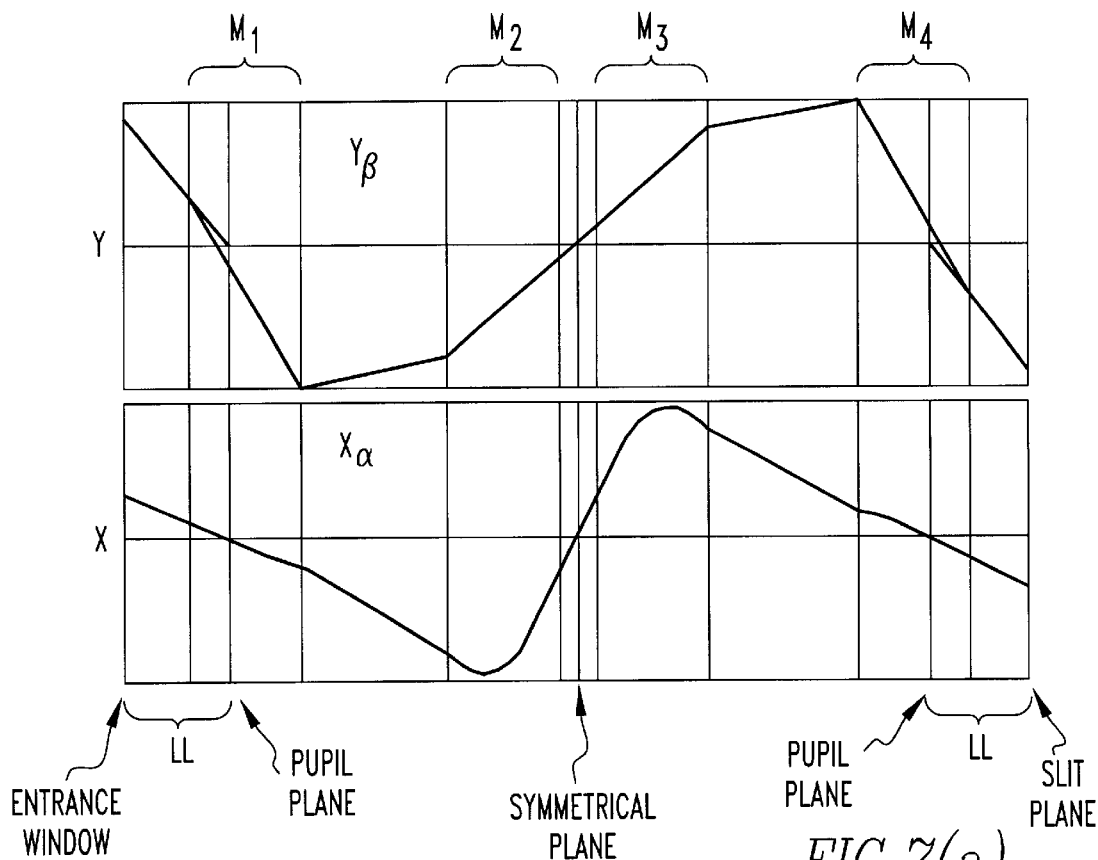
FIGS. 7(a) and 7(b) are diagrams illustrating the fundamental trajectory in the A-type OMEGA energy filter.
Figure 7B:
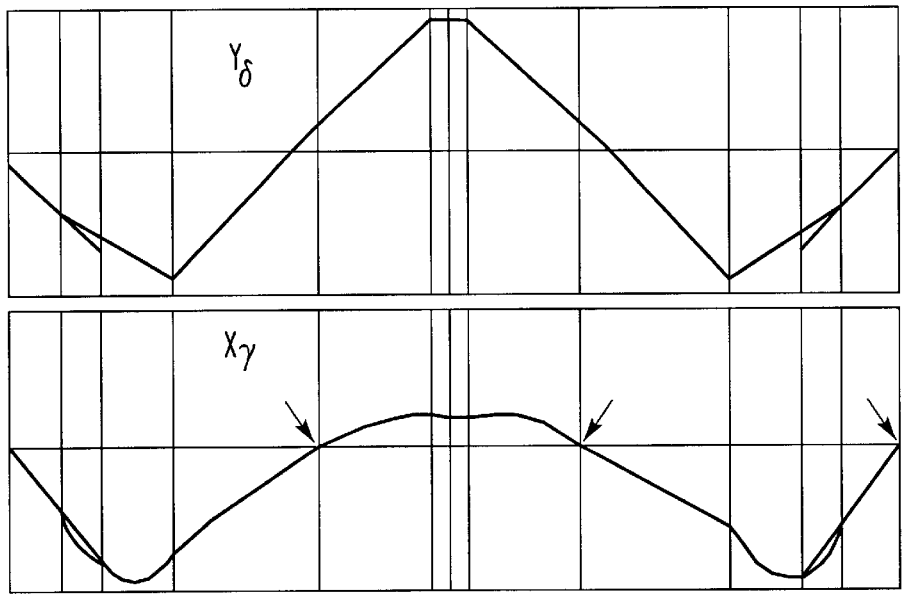
Figure 8A:
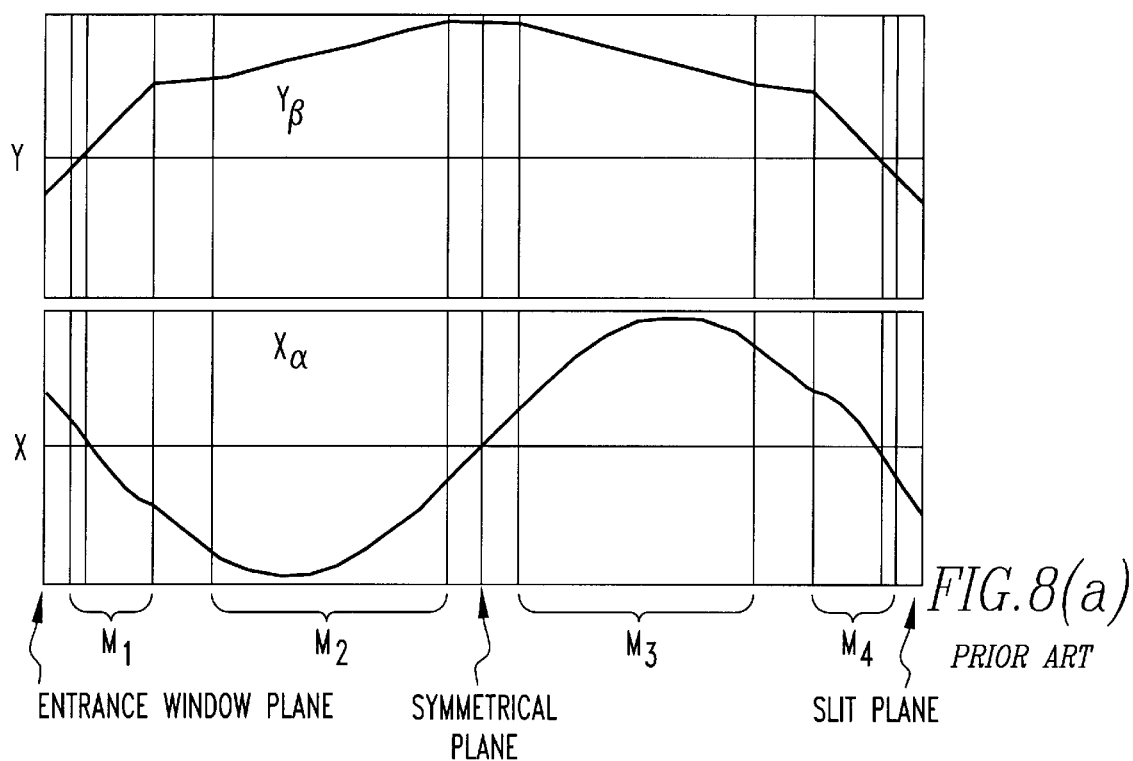
FIGS. 8(a) and 8(b) are diagrams illustrating the fundamental trajectory in the B-type OMEGA energy filter.
Figure 8B:
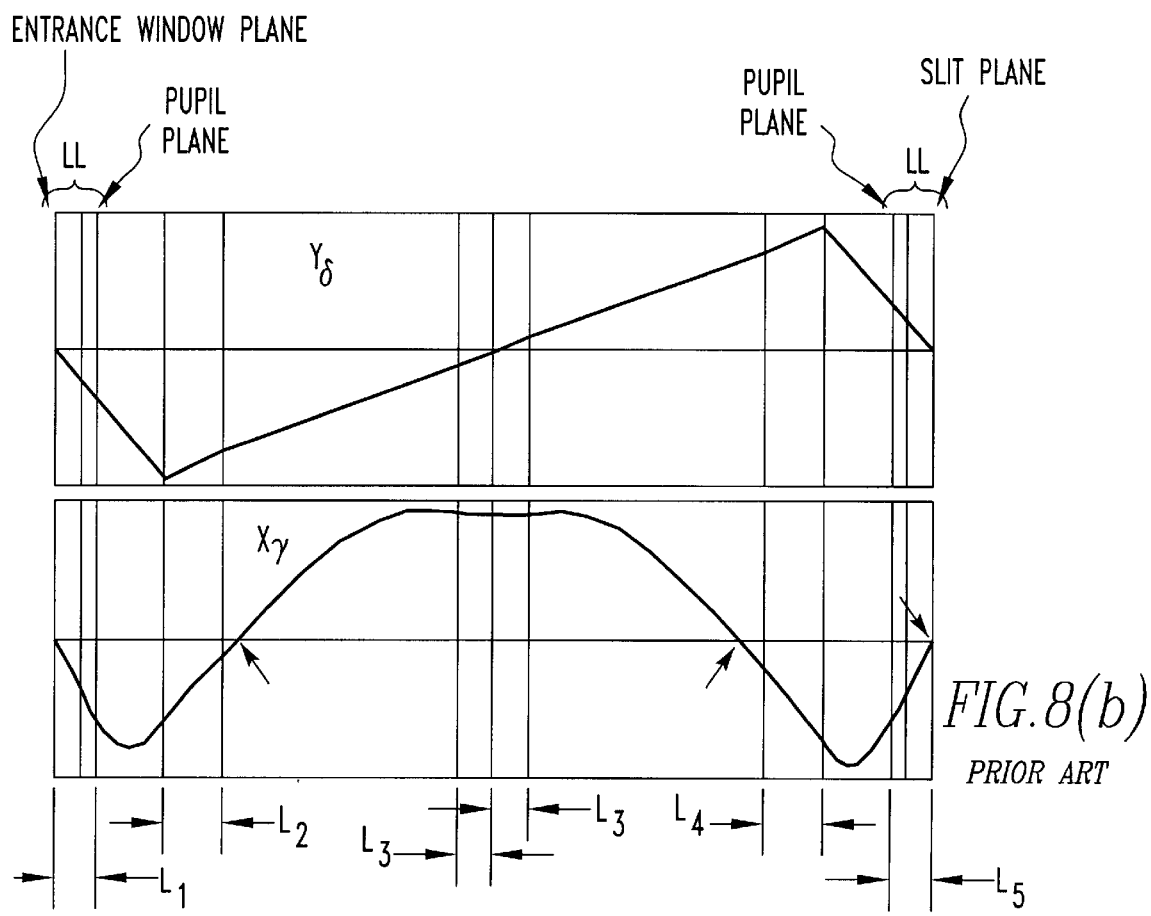

Another important characteristic is the number of times that the trajectory $x_\gamma$ crosses the optical axis. Generally, it can be thought that as the number of times that trajectory $x_\gamma$ crosses the optical axis indicating the center trajectory in the filter increases, greater dispersion takes place. The number of times the trajectory $x_\gamma$ in the prior art OMEGA filter crosses the optical axis indicating the center trajectory in the filter is three, as indicated by the arrows in FIGS. 7(b) and 8(b) for both types A and B of FIGS. 5 and 6, respectively. On the other hand, in the filter in accordance with the present invention, the number of times is four as indicated by the arrows in FIG. 2(e).

Figure 3:
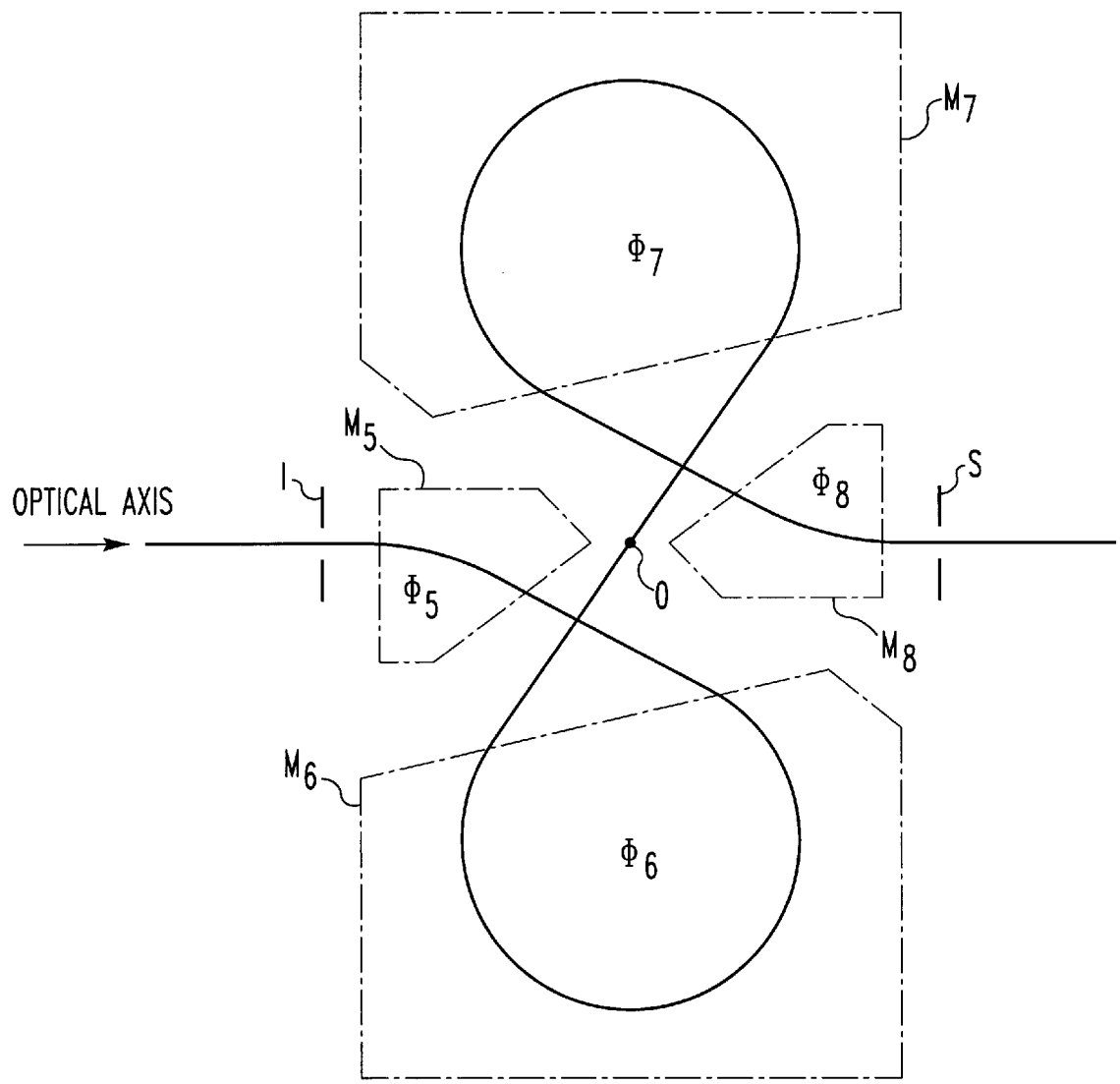
FIG. 3 is a diagram of another magnetic energy filter in accordance with the present invention.
Figure 4:
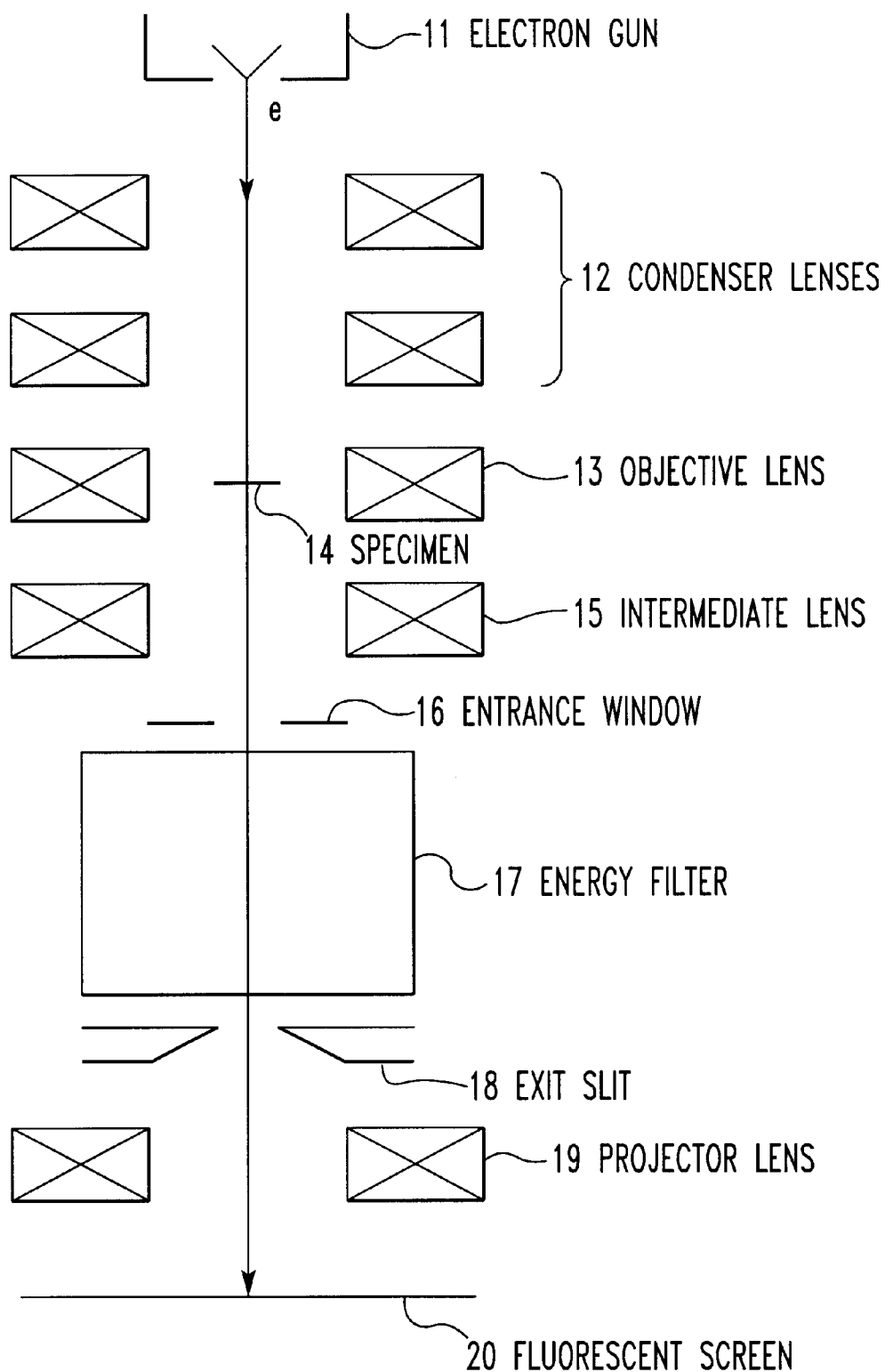
FIG. 4 is a diagram of an electron microscope having electron optics incorporating an OMEGA energy filter.

FIG. 3 is a diagram showing a magnetic energy filter in accordance with another embodiment of the present invention. This filter has magnets $M_5$–$M_8$, an entrance window I, and an exit slit S. In FIG. 3, the magnets $M_5$ and $M_6$ are both on the entrance side, i.e., on the side of the entrance window. The magnetic fields produced by these magnets $M_5$ and $M_6$ produce the same direction of beam deflection. The direction of beam deflection affected by the magnets $M_7$ and $M_8$ on the exit side, i.e., on the side of the exit slit, is opposite to the direction of beam deflection affected by the magnets $M_5$ and $M_6$ on the incident side where the entrance window is present. That is, these magnets are arranged with two-fold rotational symmetry. In particular, the magnets $M_5$ and $M_6$ have beam deflection angles of $\phi_5$ and $\phi_6$, respectively, while the magnets $M_7$ and $M_8$ have deflection angles of $\phi_7(=-\phi_6)$ and $\phi_8(=-\phi_5)$, respectively. This filter is referred to as the 8-shaped filter. In this 8-shaped filter, the sum of the absolute values of the beam deflection angles is approximately 720°.

Supplementary, it can be said that the magnetic energy filter shown in FIG. 1 and built in accordance with the present invention is one modified form of an OMEGA filter and that the magnetic energy filter shown in FIG. 3 and built in accordance with the present invention is one modified form of an ALPHA filter.

It is to be understood that the present invention is not limited to the embodiments described above. For instance, in the above-described embodiments, OMEGA and ALPHA filters are modified, and magnets are arranged on the opposite sides of a straight axis with two-fold rotational symmetry. Different types of magnets may be placed on the opposite sides of a straight axis. For example, a modification of an OMEGA filter, such as an S-filter, and a modification of an ALPHA filter may be placed on the opposite sides of a straight axis.

Furthermore, in the embodiments described above, the filter is made up of four magnets such as $M_1$–$M_4$ or $M_5$–$M_8$. In summary, a magnetic energy filter is made of four magnetic fields. For example, each of some, or all of the magnets $M_2$ and $M_3$ shown in FIG. 1 and the magnets $M_6$ and $M_7$ shown in FIG. 3 may be split into two. For example, the magnet $M_2$ may be split into two parts $M_2$-1 and $M_2$-2. That is, if one magnet is split into two and a drift space is inserted between them, the structure remains substantially unchanged.

As can be understood from the description provided thus far, the present invention provides a magnetic energy filter which has four magnetic fields to deflect the trajectory of an electron beam from the entrance window plane to the exit slit plane, the energy filter having the following features. The number of the magnetic fields is at least four. The magnetic fields located on the opposite sides of a rotational symmetry axis are opposite in polarity, the rotational symmetry axis being located midway between the second and third magnetic fields. Deflecting magnets are mounted on the opposite sides of a straight axis. The sum of the absolute values of beam deflection angles of the magnetic fields is in excess of 540° or is about 720°. Consequently, the beam path length and the sum of the absolute values of the deflection angles can be increased compared with the prior art OMEGA filter and ALPHA filter. In addition, the distance between the entrance window and the exit slit is shortened, thus making the energy filter more compact.

Having thus described our invention with the detail and particularity required by the Patent Laws, what is desired protected by Letters Patent is set forth in the following claims.

What is claimed is:

1. A magnetic energy filter having plural magnetic fields and designed to deflect a trajectory of an electron beam extending from an entrance window to an exit slit, said trajectory being in a plane, said magnetic energy filter comprising:

said magnetic fields being at least four in number and including first, second, third, and fourth magnetic fields, the trajectory of the electron beam passing through said at least four magnetic fields in the order first, second, third, and fourth;

said plural magnetic fields defining an electron trajectory that has a rotational symmetry axis located midway between said second and third magnetic fields, said axis being perpendicular to said plane; and said second and third magnetic fields located on opposite sides of a line and being opposite in polarity, said line being in said plane and intersecting said rotational symmetry axis at a point.

2. The magnetic energy filter of claim 1, wherein said plural magnetic fields include first and second magnetic fields, and wherein said first and second magnetic fields are opposite in polarity.

3. The magnetic energy filter of claim 2, wherein the sum of the absolute values of the beam deflection angles of said magnetic fields is in excess of 540°.

4. The magnetic energy filter of claim 2, wherein said magnetic fields are four in number, and wherein the beam deflection angles of said magnetic fields, respectively, are about 110°, −250°, 250°, and −110°, respectively, in this order from the entrance side.

5. The magnetic energy filter of claim 1, wherein said plural magnetic fields include first and second magnetic fields, and wherein said first and second magnetic fields are identical in polarity.

6. A magnetic energy filter having plural magnetic fields and designed to deflect a trajectory of an electron beam extending from an entrance window to an exit slit, said trajectory having a first direction in which the electron beam entering said entrance window and a second direction in which the electron beam passes through said exit slit, said second direction being aligned with said first direction, said trajectory being in a plane, said magnetic energy filter comprising:

deflecting magnets mounted on opposite sides of a straight line in said plane, said straight line connecting said entrance window and said exit slit.

7. The magnetic energy filter of claim 5 or 6, wherein the sum of the absolute values of the beam deflection angles of said magnetic fields is set to about 720°.

* * * * *

UNITED STATES PATENT AND TRADEMARK OFFICE
CERTIFICATE OF CORRECTION

PATENT NO. : 6,441,378 B1  Page 1 of 1
DATED : August 27, 2002
INVENTOR(S) : Katsushige Tsuno et al.

It is certified that error appears in the above-identified patent and that said Letters Patent is hereby corrected as shown below:

<u>Column 4,</u>
Line 67, "$\phi 4=-\phi 1$ In" should read -- $\phi 4=-\phi 1.$ In --

<u>Column 6,</u>
Line 13, "affected by" should read -- effected by --.
Line 15, "affected by" should read -- effected by --.
Line 24, "Supplementary" should read -- Supplementarily --.

Signed and Sealed this

Fourth Day of February, 2003

JAMES E. ROGAN
*Director of the United States Patent and Trademark Office*